United States Patent [19]

Inoue

[11] 4,117,751
[45] Oct. 3, 1978

[54] APPARATUS FOR INCISING ON A FILM THE PRECISE CONTOUR OF A REQUIRED IMAGE

[76] Inventor: Yoshio Inoue, No. 10, 2-chome, Tanabehigashino-cho, Higashisumiyoshi-ku, Osaka-shi, Japan

[21] Appl. No.: 745,118

[22] Filed: Nov. 26, 1976

[30] Foreign Application Priority Data

Dec. 26, 1975 [JP] Japan ............................... 50/159507

[51] Int. Cl.² .............................................. B26D 3/08
[52] U.S. Cl. ....................................... 83/868; 83/879; 83/565; 33/23 H
[58] Field of Search .................................. 83/2, 5–12, 83/565, 365, 368; 33/23 C, 23 H; 90/13.5

[56] References Cited

U.S. PATENT DOCUMENTS

| 3,593,615 | 7/1971 | Shelton | 83/565 X |
|---|---|---|---|
| 3,874,262 | 4/1975 | Cailloux | 83/565 X |
| 3,881,379 | 5/1975 | Stumf | 83/565 X |

Primary Examiner—J. M. Meister
Attorney, Agent, or Firm—George B. Oujevolk

[57] ABSTRACT

The invention relates to an apparatus for incising on a film to be processed the precise contour of a required photographic image so as to obtain a process block for prints in which such photographic image is to be inserted. The apparatus comprises a data input unit capable of detecting the precise contour by causing a light pen to trace the general contour of a required image on a photocopy; an output unit capable of incising the contour on a film to be processed by receiving signals of the positions of the precise contour detected by the input unit; and a control unit capable of performing a control operation, such as relay, comparison, etc. of the signals between the input unit and the output unit.

1 Claim, 7 Drawing Figures

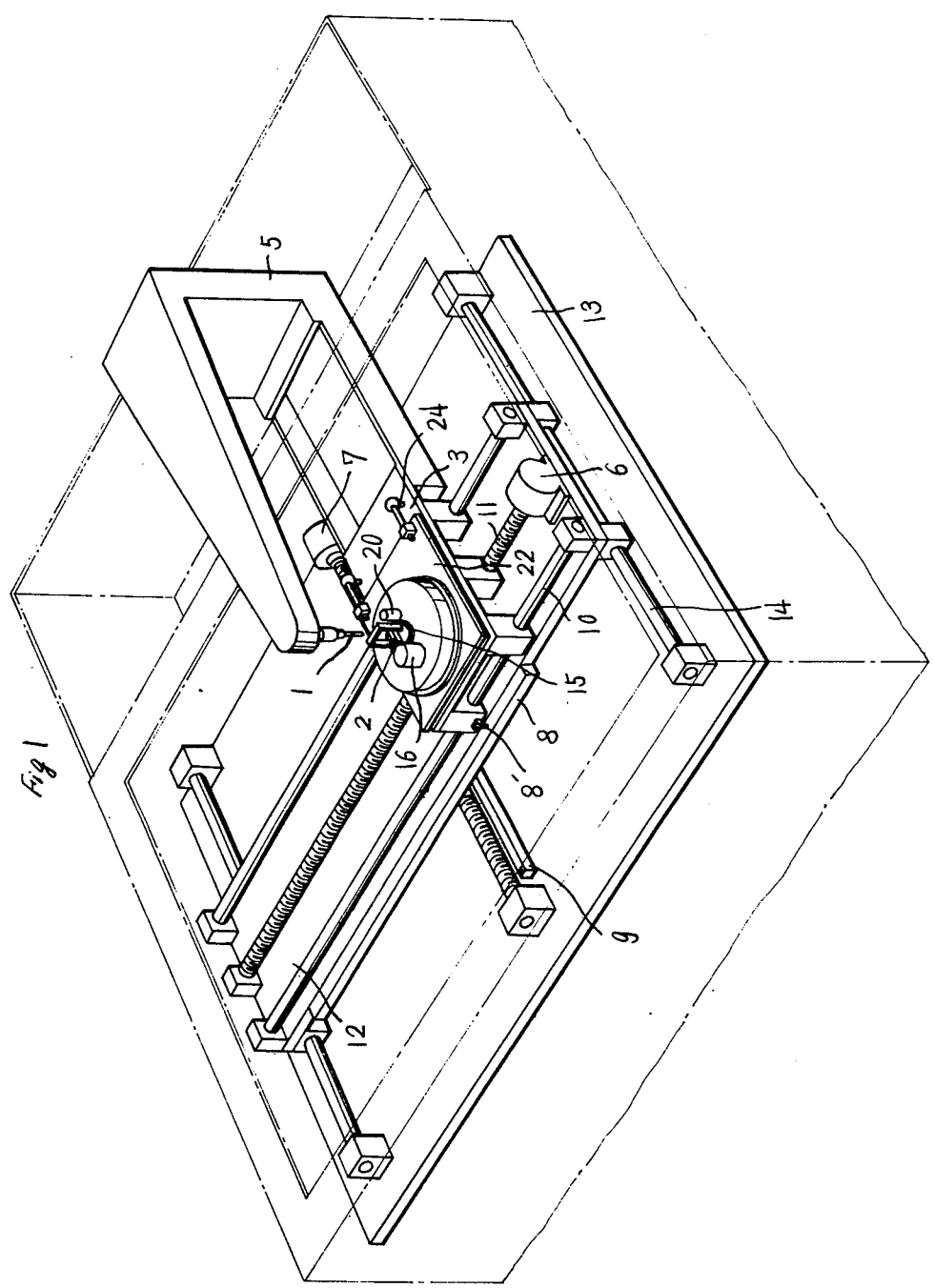

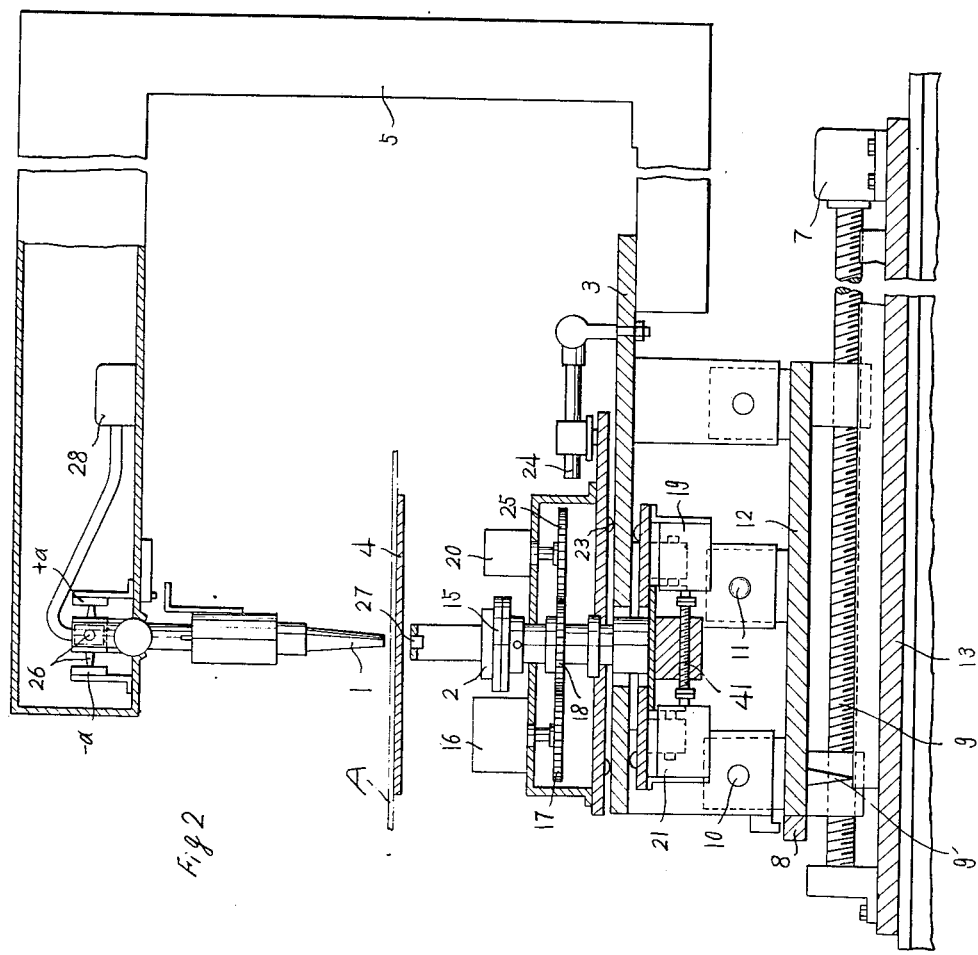

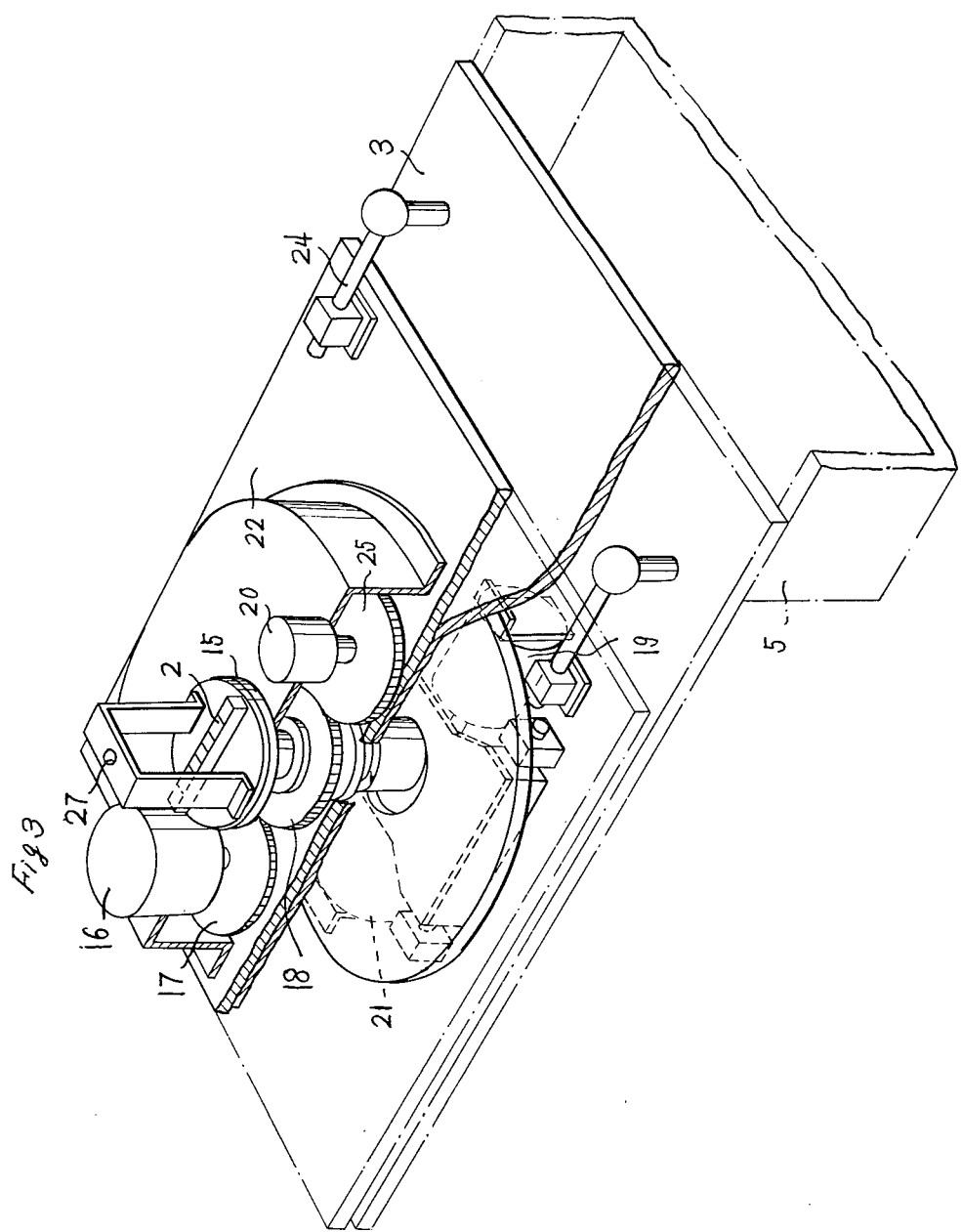

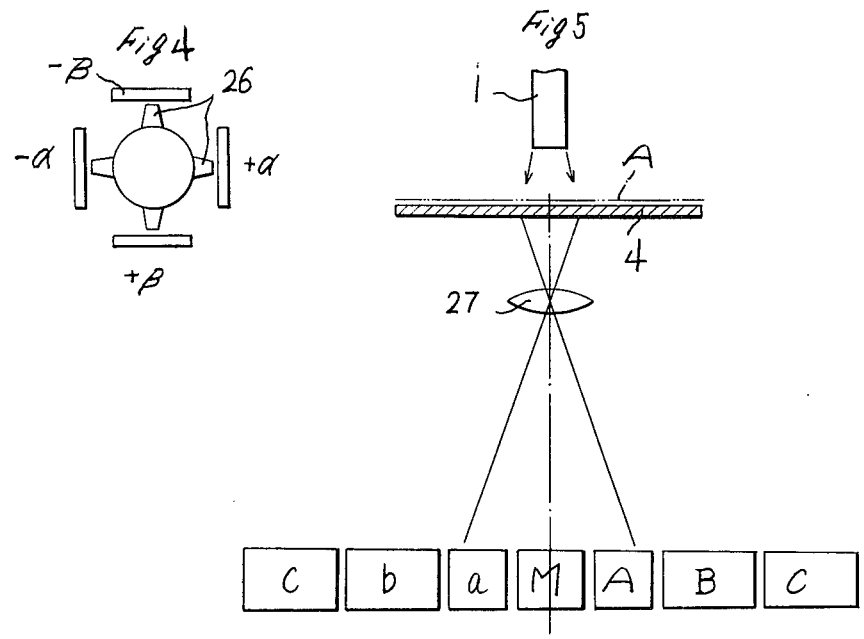
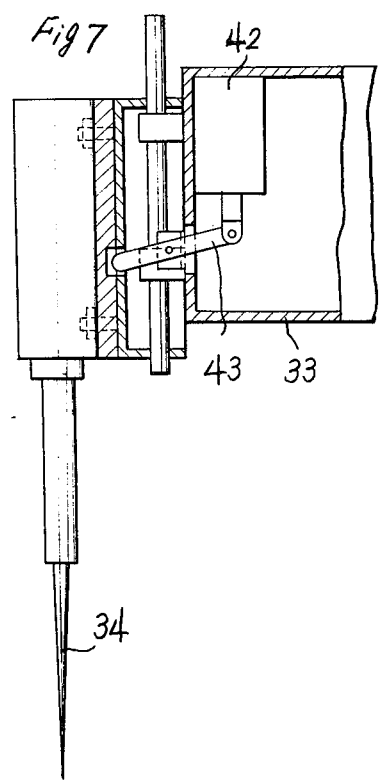

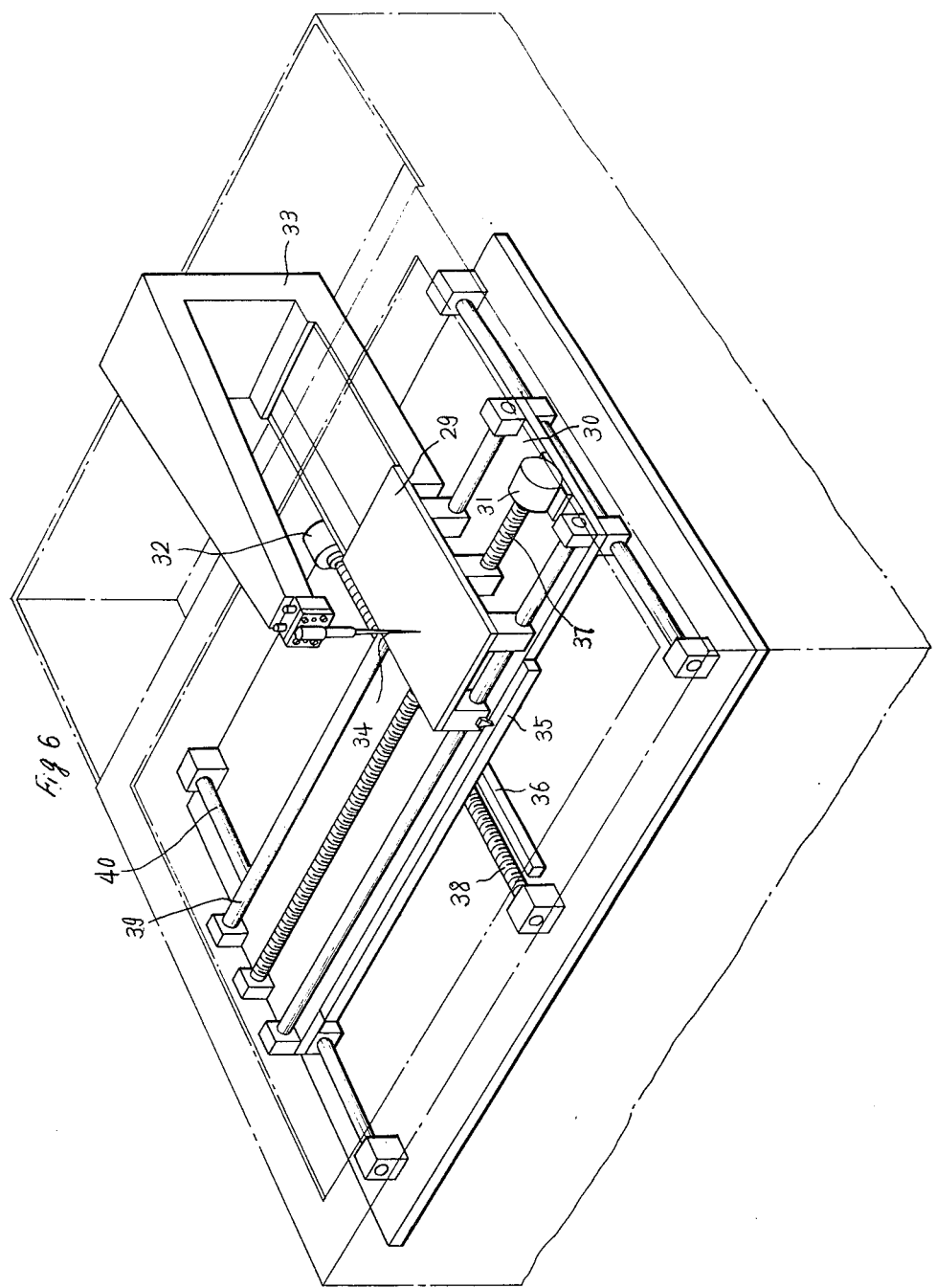

APPARATUS FOR INCISING ON A FILM THE PRECISE CONTOUR OF A REQUIRED IMAGE

The invention relates to an apparatus for use in incising on a film to be processed the precise contour of a required photographic image.

When a photographic image, for example, a human figure, an article, etc., is to be inserted in printings, a process block is prepared on the basis of a film on which the required image is photographed. However, such film invariably contains unrequisite elements, such as a landscape in the background, uneven lighting from a paper reflector, shadows and the like.

Therefore, it is the general method of process printing to determine the layout by singling out the human figure or the article against a plain background or changing the background to a different one.

The conventional method of plate making necessitated the operation of painting out the unrequisite portions by a brush, or applying a cutter to a red-coated film (a film of which the red coating alone can be exfoliated subsequently, and this film will hereinafter be referred to as a red-coated film) superposed on the photocopy and cutting the red coating along the borderline between the requisite and unrequisite portions. Moreover, a mask (a film plate) for covering the unrequisite background had to be prepared manually.

It was sometimes necessary to paint or cut slightly on the inside or outside of the borderline (contour), and this operation required considerable skill, patience and dexterity, to say nothing of great visual power. (Finger movement of about 0.2–0.3 mm was required for this operation.)

For example, cutting out the hair of a woman or spokes of a bicycle from the background was done with great difficulty.

A first object of the invention is to provide an apparatus for incising on a film to be processed the precise contour of a required image enabling to incise with simplicity of a red-coated film the precise contour of a required image on a photocopy by roughly tracing the contour with a light pen.

A second object of the invention is to provide an apparatus for incising on a film to be processed the precise contour of a required image enabling to enlarge or reduce the contour with simplicity and rapidity by feeding a particular compensation value during the incising operation.

A third object of the invention is to provide an apparatus for incising on a film to be processed the precise contour of a required image which is easy to handle and requires no particular skill.

A fourth object of the invention is to provide an apparatus for incising on a film to be processed the precise contour of a required image enabling to modity the contour of a required image on a photocopy with a beautiful finish.

These and other objects are accomplished by the parts, improvements, combinations and arrangements comprising the invention, a preferred embodiment of which is shown by way of example in the annexed drawings and herein described in detail. Various modifications and changes in details of construction are comprehended within the scope of the annexed claims.

FIG. 1 is a perspective view showing the data input unit of the invention.

FIG. 2 is a longitudinal, sectional view of the foregoing.

FIG. 3 is a perspective view of the essential part of the foregoing.

FIG. 4 is a plan view showing the arrangement of piezoelectric sensing elements in the upper part of a light pen.

FIG. 5 is a plan view showing the arrangement of photoelectric conversion elements.

FIG. 6 is a perspective view showing the output unit of the invention.

FIG. 7 is a side view showing an elevator device for a supersonic microneedle of the foregoing.

Broadly, the apparatus of the invention comprises three essential components, a first component being a data input unit capable of detecting the precise contour of a required image on a photocopy by moving a light pen along the general contour thereof; a second component being an output unit capable of incising the precise contour on a film to be processed by receiving signals of the positions of the precise contour detected by the input unit; a third component being a control unit capable of performing a control operation, such as relay, comparison, etc. of the signals between the input unit and the output unit.

The following is the description of the input unit. As shown in FIGS. 1, 2 and 3, a light pen 1 movable along the contour of an image on a photocopy A and photoelectric conversion elements 2 receiving light from the light pen 1 are mounted on a movable table 3 and integrally connected by an arm 5 so as to be vertically opposite to each other with interposition of a photocopy A receiving table consisting of plate glass and the like.

The light pen 1 and the photoelectric conversion elements 2 are adapted to move integrally with the movable table 3 longitudinally and transversely (in the directions of the coordinates, $x$, $y$) by a longitudinally feeding servomotor 7 and a transversely feeding servomotor 6. Each movement is detectable by linear magnetic scales 8, 9 longitudinally and transversely provided respectively. To be more precise, values put out through heads 8', 9' of the magnetic scales 8, 9 are taken out as position signals.

The numeral 10 designates a guide shaft of the movable table 3, the guide shaft 10 together with a threaded bar 11 rotatable both ways by the connection of the transversely feeding servomotor 6 being provided on the lower movable table 12, the lower movable table 12 being supported by a guide bar 14 on the upper face of base plate 13 so as to be movable in the rectangular direction relative to the movable table 3.

Table 15 on which the photoelectric conversion elements 2 are mounted is rotary relative to the movable table 3, the table 15 being adapted to rotate in such manner that the alignment of the photoelectric conversion elements is invariably at right angles with the contour of the photographic image, i.e. the moving direction of the light pen 1, as a result of the clockwise or counterclockwise rotation of the servomotor 6 with interposition of gears 17, 18. At the same time, the linear micromovement is controlled by the clockwise or counterclockwise rotation of motor 19 in such manner that the center of the photoelectric conversion elements 2 is brought to the center of the density slope of the contour.

The numeral 20 designates a resolver provided with interposition of a gear 25 connected to the gear 18, the resolver 20 being for use in detecting the position thereby enabling to consecutively modify the photoelectric conversion elements 2 in the rectangular direction relative to the moving direction of the light pen 1.

The numeral 21 designates a potentiometer for obtaining resistance values proportional to the linear movement of the table 15. To be more precise, the variation of the potentiometer 21 is put out as a compensation value relative to the precise contour.

A plate 22 on which the table 15 is rotatably mounted is provided on the movable table 3 with interposition of balls 23 so as to allow micromovement in the longitudinal direction. Furthermore, the movable table 3 and the plate 22 are provided with a rotation stop shaft 24.

The light pen 1 is movable in all directions with its central portion as a fulcrum, a hammer 26 being provided at each quadrisected position of the periphery of the movable upper end of the light pen 1 as shown in FIG. 4, piezoelectric sensing elements, $-\alpha$, $+\alpha$, $-\beta$, $+\beta$, being provided in the positions opposite to the hammers 26 respectively, whereby each corresponding element is adapted to transmit piezoelectricity in accordance with the direction of the movement of the light pen 1. As a result, the longitudinally feeding servomotor 7 and the transversely feeding servomotor 6 are rotated clockwise or counterclockwise thereby enabling the movable table 3 and the lower movable table 12 to move in the direction of the movement of the light pen 1. Therefore, the mechanism has semipermanent durability.

As shown in FIG. 5, the photoelectric conversion elements 2 are arranged in such manner that three elements, A, B and C, are aligned in the right-hand direction, while three other elements, a, b and c, are aligned in the left-hand direction with the central element M as a basis respectively. The light source of the light pen 1 is consecutively modified so as to point the central portion of the photoelectric conversion elements 2 through a lens 27 as shown in FIG. 2. The numeral 23 designates the light source of the light pen 1.

The output unit is substantially similar to the input unit as shown in FIG. 6. A transversely movable body 29 and a longitudinally movable body 30 are moved by differential signals through comparison between the position detecting signals from the input unit and the respective positions of the movable bodies 29, 30. Thus, the longitudinal and transverse movements of the movable bodies 29, 30 are controlled by compensating the signals of the contour traced by the light pen.

The movable bodies 29, 30 are driven by two-way motors 31, 32 with interposition of threaded bars 37, 38, the movable bodies 29, 30 being provided with magnetic scales 35, 36 for the confirmation of the longitudinal and transverse positions respectively (the coordinates, X, Y).

A supersonic microneedle 34 for cutting the coating only of the film to be processed is provided at the foremost end of an arm 33 movable with the movable bodies 29, 30.

Referring to FIG. 6, the numeral 39 designates a guide shaft of the transversely movable body 29, 40 designating a guide shaft of the longitudinally movable body 30, 41 designating a threaded shaft.

The foregoing is the construction of the invention, and its operation will now be described in detail. As shown in FIG. 2, a photocopy A is set on the upper face of the plate glass 4, a red-coated film being secured onto the table of the output unit. If the light pen 1 is moved along the contour of an image on the photocopy A (for example, within an error of ±2 mm or thereabout), the light pen 1 is subjected to a pressure in the direction of its movement. As a result, one of the hammers 26 provided at the upper end of the light pen 1 presses the corresponding piezoelectric sensing element. The pressure applicable to each element is selected according to the direction of the pressure applied to the light pen 1 thereby enabling to transmit a signal of the corresponding direction. The servomotors 6, 7 of the movable tables 3, 13 are driven clockwise or counterclockwise by the transmitted signals, the movable tables 3, 13 being moved longitudinally or transversely in the direction of the movement of the light pen 1.

If the movable tables 3, 13 are moved in the direction of the movement of the light pen 1, the respective positions of the movable tables 3, 13 (coordinates, x, y) can be detected by means of the magnetic scales 8, 9.

Each signal of the moving direction put out from the light pen 1 is fed into the resolver 20 in which the directional angle $\theta$ is computed, the servomotor 16 being driven thereby controlling the rotation of the table 15 in such manner that the photoelectric conversion elements are consecutively aligned at right angles with the directional angle $\theta$. The rotary power is transmitted from the output axis of the motor 16 through the gears 17, 18, synchronously the directional angle of the resolver 20 being modified through the gear 25.

At the same time, comparison between each element of the photoelectric conversion elements is effected with the element M as the center, the clockwise or counterclockwise rotation of the motor 19 being controlled by the differential signal in such manner that the density border point of the photocopy consecutively coincides with the element M. If the motor 19 is driven clockwise or counterclockwise, the table 15 is rotated through threaded shaft 41 in the direction of the alignment of the elements, synchronously the potentiometer 21 being rotated thereby indicating the compensation value between the precise contour and the moving line of the light pen 1, the deviation amount $\pm\eta$ from the original point being sequentially taken out through the signal from each head of the magnetic scales 8, 9 and the output of the potentiometer 21.

To be more precise, the microcompensation amount $\eta$ by the potentiometer 21 is divided in the direction of the output signals, x, y, from the respective magnetic scales, the resultant amounts, $\delta x$, $\delta y$, $$\delta x = \eta \cos \theta$$

$$\delta y = \eta \sin \theta$$

being added to or subtracted from the output, x, y, of the magnetic scales after analog digital conversion, subsequently the formulas $$X = x + \delta x$$

$$Y = y + \delta y$$

being stored in the control unit as the values of the precise borderline (contour).

The timing of this storing, or memorizing, is set at a predetermined time spacing (for example, 300 mS). When the logical result (AND) of the clock pulse from the oscillator and the center coincidence signal of the photoelectric conversion elements is obtained, X and Y are computed according to the foregoing formulas by detecting the respective values of $x$, $y$, $\eta$, subsequently $X$, $Y$ and $\sin \downarrow$, $\cos \theta$ being stored in the control unit.

The output unit drives the motors 31, 32 clockwise or counterclockwise by reading the memorized values sequentially, the movable bodies 29, 30 being driven in the directions of the coordinates, X, Y, respectively thereby causing the supersonic microneedle 34 to move in conformity with the precise contour.

According as the supersonic microneedle 34 travels on the film to be processed, consecutive holes are formed in the red coating of the film by supersonic vibrations, incision in conformity with the precise contour being performed as a result.

Furthermore, the supersonic microneedle 34 provided at the foremost end of the arm 33 is elevatable within a predetermined scope by means of a solenoid 42 with interposition of an arm 43. This is to facilitate setting of the film to be processed by elevation the needle 34.

According to the invention, as described hereinbefore, a light pen 1 is moved along the general contour of a required image on a photocopy, the position of the light pen 1 being detected by the coordinates, $x$, $y$, synchronously an error relative the precise contour being detected as a compensation value, the compensation value being added to or subtracted from the detected output of each position, the values of the precise contour thus obtained being stored sequentially, the stored values being transferred to the output unit so as to move a supersonic microneedle 34 longitudinally or transversely thereby enabling to cut the red coating of the film to be processed in conformity with the precise contour of the image, the unrequisite portion of the red coating being exfoliated subsequently. Therefore, the invention has an advantage in that red coating can be cut in conformity with the precise contour unlike the case of the conventional method which necessitated the troublesome operation of painting out or cutting off the unrequisite portion along the contour.

Moreover, since a supersonic microneedle is employed for incising an image on the film, the invention enables to obtain very sharp incision. In addition, the contour can be enlarged or reduced with simplicity by adding or subtracting a particular number to or from the output value of the input unit thereby enabling to freely modify the image of the photocopy.

What is claimed is:
1. In a precision instrument for incising on a film placed on a second surface of an output unit, the contour of an image located on a first surface of an input unit, each unit having a lower table with longitudinal guides, moveable in the longitudinal direction and an upper table with transverse guides disposed on said lower table moveable in the transverse direction and threaded drive shafts including servomotor drive means coupled to each table so that the location of the input unit upper table can be substantially reproduced with the output unit upper table, in combination:
   (a) an arm 33 on said output unit with a vertical cutting needle 34 extending therefrom disposed for cutting a film placed on said second flat surface including solenoid means for raising and lowering said needle;
   (b) an arm 5 on the input unit extending over said unit with a vertical light pen 1 moveable in the horizontal plane disposed thereon, said pen having an upper pen end held by said arm and a light emitting lower end for emitting light towards said input unit upper table;
   (c) a glass plate 4 disposed between said input unit upper table and said light pen 1 said glass plate 4 serving to support the image whose contours are to be followed;
   (d) a horizontally rotatable light receiving table 15 disposed on said input unit upper table under said light pen 1, said rotatable table 15 including a lens 27 disposed over the table, photoelectric conversion units 2 disposed on said rotatable table for receiving said light, said table being adapted to rotate in such a way that the alignment of the photoelectric conversion units 2 is at right angles to the direction of the movement of said light pen 1;
   (e) hammer means 26 held by said arm 5 at said upper pen end and piezoelectric sensing elements disposed opposite said hammer; and,
   (f) servo means coupled to said photoelectric conversion units 2, said piezoelectric sensing elements, and said servomotor drive to drive said light pen 1 over said contour and drive, said cutting needle 34 to follow the movements of said pen.

* * * * *